US009428646B2

(12) United States Patent
Hsieh

(10) Patent No.: US 9,428,646 B2
(45) Date of Patent: *Aug. 30, 2016

(54) LOW DIELECTRIC HALOGEN-FREE RESIN COMPOSITION AND CIRCUIT BOARD USING THE SAME

(71) Applicant: ELITE MATERIAL CO., LTD., Tao-Yuan Hsien (TW)

(72) Inventor: Chen-Yu Hsieh, Taoyuan County (TW)

(73) Assignee: ELITE MATERIAL CO., LTD., Taoyuan (TW)

(*) Notice: Subject to any disclaimer, the term of this patent is extended or adjusted under 35 U.S.C. 154(b) by 77 days.

This patent is subject to a terminal disclaimer.

(21) Appl. No.: 13/948,399

(22) Filed: Jul. 23, 2013

(65) Prior Publication Data
US 2014/0349090 A1    Nov. 27, 2014

(30) Foreign Application Priority Data

May 21, 2013  (TW) .............................. 102117963 A

(51) Int. Cl.
| | | |
|---|---|---|
| *C08G 79/02* | (2006.01) | |
| *B32B 15/14* | (2006.01) | |
| *C08L 63/00* | (2006.01) | |
| *C08L 71/02* | (2006.01) | |
| *H05K 1/03* | (2006.01) | |

(52) U.S. Cl.
CPC ............. *C08L 71/02* (2013.01); *H05K 1/0353* (2013.01); *H05K 2201/012* (2013.01); *H05K 2201/0209* (2013.01); *Y10T 428/24917* (2015.01); *Y10T 428/31681* (2015.04)

(58) Field of Classification Search
CPC .... C08L 71/02; H05K 1/056; H05K 1/0353; H05K 2201/012; H05K 2201/0209; Y10T 428/24917; Y10T 428/31681

USPC ......... 428/209, 458; 524/122; 526/276, 262, 526/275; 528/399, 398, 486; 548/956; 558/75

See application file for complete search history.

(56) References Cited

U.S. PATENT DOCUMENTS

| | | | | |
|---|---|---|---|---|
| 4,874,828 | A * | 10/1989 | Lukacs, III | 526/262 |
| 5,912,321 | A * | 6/1999 | Raith et al. | 528/399 |
| 6,440,567 | B1 | 8/2002 | Choate et al. | |
| 7,255,925 | B2 | 8/2007 | Chung et al. | |
| 9,000,077 | B2 * | 4/2015 | Hsieh | 524/122 |
| 2008/0300350 | A1 * | 12/2008 | Ohno et al. | 524/147 |
| 2009/0203279 | A1 * | 8/2009 | Mori et al. | 442/233 |

FOREIGN PATENT DOCUMENTS

EP    0763566 A1    3/1997

* cited by examiner

*Primary Examiner* — Michael B Nelson
(74) *Attorney, Agent, or Firm* — WPAT, P.C., Intellectual Property Attorneys; Anthony King

(57) ABSTRACT

A halogen-free resin composition includes (A) 100 parts by weight of polyphenylene oxide resin; (B) 10 to 50 parts by weight of maleimide resin; (C) 5 to 100 parts by weight of polybutadiene copolymer; (D) 5 to 30 parts by weight of cyanate ester resin; and (E) 15 to 150 parts by weight of phosphazene. The halogen-free resin composition is characterized by specific ingredients and proportions thereof to achieve circuit board laminate properties, such as a high glass transition temperature, low coefficient of thermal expansion, low dielectric properties, heat resistance, flame retardation, and being halogen-free, and thus is applicable to the manufacturing of a prepreg or resin film, thereby being applicable to the manufacturing of metal laminates and printed circuit boards.

11 Claims, 3 Drawing Sheets

LOW DIELECTRIC HALOGEN-FREE RESIN COMPOSITION AND CIRCUIT BOARD USING THE SAME

CROSS-REFERENCE TO RELATED APPLICATION

This non-provisional application claims priority under 35 U.S.C. §119(a) on Patent Application No(s). 102117963 filed in Taiwan, R.O.C. on May 21, 2013, the entire contents of which are hereby incorporated by reference.

FIELD OF THE INVENTION

The present invention relates to halogen-free resin compositions, and more particularly, to halogen-free resin composition applicable to printed circuit boards.

BACKGROUND OF THE INVENTION

To get in line with the global trend of environmental protection and eco-friendly regulations, electronic product manufacturers nowadays are developing and manufacturing halogen-free electronic products. Advanced countries and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts and components. A printed circuit board (PCB) is an indispensable and fundamental basis of the semiconductor industry and electronic industry; hence, printed circuit boards bore the brunt of international halogen-free regulations when international organizations set forth strict requirements of the halogen content of printed circuit boards. For example, the International Electrotechnical Commission (IEC) 61249-2-21 requires that bromine content and chloride content shall be less than 900 ppm and the total halogen content shall be less than 1500 ppm. The Japan Electronics Packaging and Circuits Association (JPCA) requires that both bromide content and chloride content shall be less than 900 ppm. To enforce its green policies, Greenpeace calls on manufacturers worldwide to get rid of polyvinyl chloride (PVC) and brominated flame retardants (BFRs) from their electronic products in order to conform with the lead-free and halogen-free requirements of green electronics. Hence, the industrial sector nowadays is interested in rendering related materials halogen-free and sees this technique as one of its key research topics.

Electronic products nowadays have the trend toward compactness and high-frequency transmission; hence, circuit boards nowadays typically feature a high-density layout and increasingly strict material requirements. To mount high-frequency electronic components on a circuit board, it is necessary that the substrate of the circuit board is made of a material of a low dielectric constant (Dk) and dielectric dissipation factor (Df) in order to maintain the transmission speed and the integrity of a signal transmitted. To allow the electronic components to function well at a high temperature and a high-humidity environment, it is necessary for the circuit board to be heat resistant, flame resistant, and of low hygroscopicity. Epoxy resin is adhesive, heat resistant, and malleable and thus is widely applicable to encapsulants and copper clad laminates (CCL) of electronic components and machinery. From the perspective of fire prevention, epoxy resin is incapable of flame retardation, and thus epoxy resin has to acquire flame retardation capability by including a flame retardant therein. For example, a halogen, such as bromine, is included in epoxy resin to not only bring about flame retardation capability thereof but also enhance epoxy reactivity. However, electronic products developed in recent years have a trend toward being lightweight, compact, and circuit-miniaturized. Due to the aforesaid requirement, halides which have a large specific gravity are undesirable from the perspective of weight reduction. Furthermore, after long use, halides are likely to decompose at high temperature, which often results in corrosion of fine circuits. Also, upon their combustion, discarded electronic parts and components produce halides which are most hazardous and environmentally unfriendly. To find an alternative to the aforesaid halide-based flame retardant, researchers attempt to use a phosphorous compound as a flame retardant, for example, adding phosphate ester (U.S. Pat. No. 6,440,567) or red phosphorus (EP 0763566) to an epoxy resin composition. However, phosphate ester undergoes hydrolysis readily to produce an acid, thereby compromising its tolerance to migration. Although red phosphorus is good at flame retardation, it falls into the category of hazardous compounds under the firefighting law, because it produces a trace of a flammable, toxic gas known as phosphine in a humid environment at high temperature.

U.S. Pat. No. 7,255,925 discloses a thermosetting resin composition composed of cyanate ester resin, dicyclopentadiene (DCPD) epoxy resin, silica, and a thermoplastic resin. The thermosetting resin composition is characterized by a low dielectric constant (Dk), and a low dielectric dissipation factor. However, a method for manufacturing the thermosetting resin composition of U.S. Pat. No. 7,255,925 requires the use of a halogen-containing (such as bromine-containing) flame retardant, such as tetrabromocyclohexane, hexabromocyclodecane, or 2,4,6-tris(tribromophenoxy)-1,3, 5-triazine. However, the bromine-containing flame retardant causes environmental pollution readily during the thermosetting resin composition manufacturing process, the using processing of thermosetting resin composition, and even after the thermosetting resin composition has been discarded or recycled. To ensure a low dielectric dissipation factor, low hygroscopicity, high cross-linking density, high glass transition temperature, high connectivity, appropriate thermal expansion, heat resistance, and flame retardation of metal clad laminates, an important factor lies in the selection of an epoxy resin, a curing agent, and a reinforcement material.

At present, to enable environment-friendly halogen-free resin compositions to attain UL94 V-0 flame retardation, it is usually necessary to add thereto a phosphorus-containing flame retardant. The phosphorus-containing flame retardant preferably contains a phosphazene. However, a conventional phosphazene (such as SPB-100 manufactured by Otsuka Chemical Co., Ltd. (hereinafter "Otsuka Chemical")) lacks a reactive functional group, and, as a result, the conventional phosphazene contained in a halogen-free resin composition cannot react with any other resin. As a result, a laminate manufactured from the halogen-free resin composition has an overly large coefficient of thermal expansion, thereby causing a circuit board manufactured from the laminate to crack internally during a manufacturing process and reducing the yield. In view of this, phosphazene suppliers further developed a phosphazene having a hydroxyl group (such as SPH-100 manufactured from Otsuka Chemical). Due to its hydroxyl group, SPH-100 reacts with any other resin readily. However, SPH-100 has a disadvantage, that is, its hydroxyl group results in overly high dielectric constant (Dk) and overly high dielectric dissipation factor (Df).

polyphenylene oxide resin, as any conventional polyphenylene oxide resin can function as the ingredient (A) polyphenylene oxide resin. The ingredient (A) polyphenylene oxide resin preferably comprises at least one of the following chemical structures:

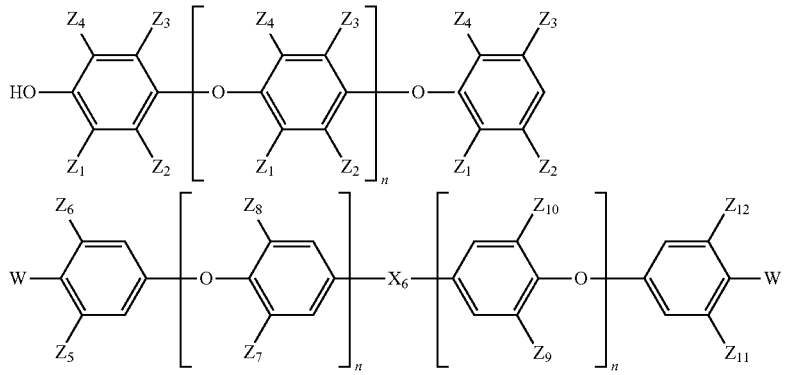

The major considerations given to electrical properties include the dielectric constant and the dielectric dissipation factor. In general, the signal transmission speed of a laminate is inversely proportional to the square root of the dielectric constant of the material from which the laminate is made, and thus the minimization of the dielectric constant of the laminate material is usually advantageously important. The lower the dielectric dissipation factor is, the lesser the signal transmission attenuation is; hence, a material of a low dielectric dissipation factor provides satisfactory transmission quality.

Accordingly, it is important for printed circuit board material suppliers to develop materials of a low dielectric constant and a low dielectric dissipation factor, and apply the materials to high-frequency printed circuit board manufacturing.

SUMMARY OF THE INVENTION

In view of the aforesaid drawbacks of the prior art, the inventor of the present invention conceived room for improvement in the prior art and thus conducted extensive researches and experiments according to the inventor's years of experience in the related industry, and finally developed a halogen-free resin composition.

It is an objective of the present invention to provide a halogen-free resin composition characterized by specific ingredients and proportions thereof to attain circuit board laminate properties, such as a high glass transition temperature, low coefficient of thermal expansion, low dielectric properties, heat resistance, flame retardation, and being halogen-free, and therefore is applicable to the manufacturing of a prepreg or a resin film to thereby be applicable to metal-clad laminates and printed circuit boards.

In order to achieve the above and other objectives, the present invention provides a halogen-free resin composition which comprises: (A) 100 parts by weight of polyphenylene oxide resin; (B) 10 to 50 parts by weight of maleimide resin; (C) 5 to 100 parts by weight of polybutadiene copolymer; (D) 5 to 30 parts by weight of cyanate ester resin; and (E) 15 to 150 parts by weight of phosphazene.

As regards the resin composition of the present invention, there is not any specific limitation to the ingredient (A)

Where $X_6$ is a covalent bond, $-SO_2-$, $-C(CH_3)_2-$, $-CH(CH_3)-$, $-CH_2-$; $Z_1$ to $Z_{12}$ independently represent hydrogen and methyl; W is hydroxyl, vinyl, vinyl benzyl ether, styryl, allyl, butenyl, butadienyl or epoxy; n is an integer larger than or equal to 1.

The polyphenylene oxide resin of the resin composition of the present invention is preferably selected from one of hydroxyl-terminated polyphenylene oxide resin (such as SA-90 produced by Sabic), vinyl-terminated or allyl-terminated polyphenylene oxide resin (such as SA-9000 produced by Sabic), and vinyl benzyl ether-terminated polyphenylene oxide resin (such as OPE-2st produced by Mitsubishi Gas Chemical) or combination thereof.

The (B) maleimide resin included in the resin composition of the present invention is preferably at least one selected from the group consisting of: 4,4'-diphenylmethane bismaleimide, oligomer of phenylmethane maleimide, m-phenylenebismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6-bismaleimide-(2,2,4-trimethyl)hexane.

There is not any specific limitation to (C) polybutadiene copolymer in the resin composition of the present invention, as (C) polybutadiene copolymer can be any conventional polybutadiene copolymer, such as styrene-butadiene copolymer, polybutadiene homopolymer, hydrogenated diene-butadiene-styrene copolymer, maleic anhydride diene-butadiene-styrene copolymer, styrene-butadiene-styrene copolymer, styrene-isoprene-styrene copolymer, styrene-butadiene-divinyl benzene terpolymer, or maleic anhydride styrene-butadiene copolymer.

There is not any specific limitation to the (D) cyanate ester resin included in the resin composition of the present invention; hence, the resin composition of the present invention can contain any conventional cyanate ester resin, for example, any compound having Ar—O—C≡N, where Ar is a substituted or unsubstituted benzene, biphenyl, naphthalene, phenol novolac, bisphenol A, bisphenol A novolac, bisphenol F, bisphenol F novolac, or phenolphthalein. Furthermore, the Ar is further bonded with a substituted or unsubstituted dicyclopentadienyl (DCPD).

In an embodiment of the present invention, the cyanate ester resin is preferably selected from the group consisting of the following:

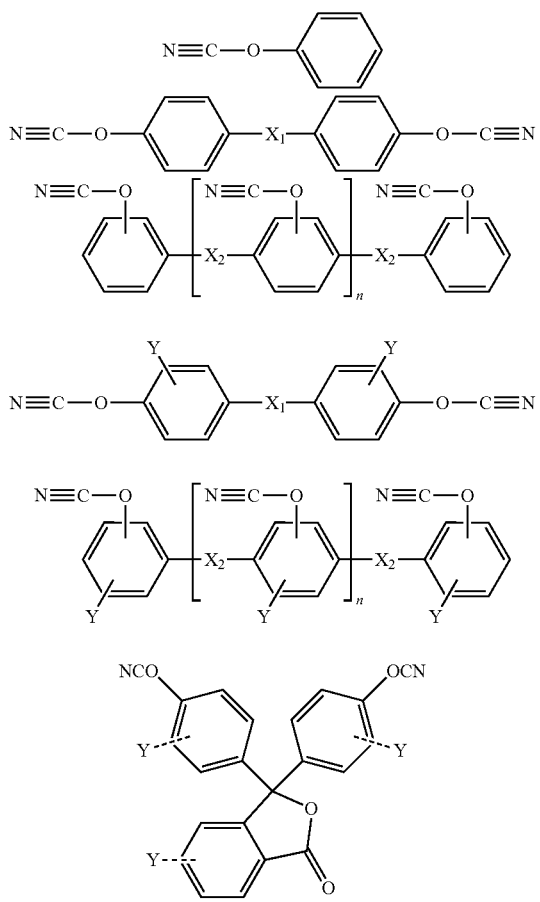

where $X_1$, $X_2$ independently represent at least one R, Ar', $SO_2$ or O; R is selected from —$C(CH_3)_2$—, —$CH(CH_3)$—, —$CH_2$— or dicyclopentadienyl (DCPD)-containing group; Ar' is selected from the group consisting of benzene, biphenyl, naphthalene, phenol novolac, bisphenol A, triazole, hydrogenated bisphenol A, bisphenol A novolac, bisphenol F, and bisphenol F novolac; n is an integer larger than or equal to 1; and Y is an aliphatic functional group or an aromatic functional group.

The aforesaid aliphatic functional group is a $C_1$-$C_{30}$ alkane, alkene, alkyne, cyclic alkane, cyclic alkene, or a derivative thereof. The aforesaid aromatic functional group is a $C_1$-$C_{14}$ compound having a benzene ring, such as benzene, naphthalene, anthracene, or a derivative thereof.

Examples of the cyanate ester resin added to the resin composition of the present invention include, but are not limited to, Primaset PT-15, PT-30S, PT-60S, CT-90, BADCY, BA-100-10T, BA-200, BA-230S, BA-3000S, BTP-2500, BTP-6020S, DT-4000, DT-7000, Methylcy, ME-240S, which are manufactured by Lonza, and any combination thereof. The cyanate ester resin in the resin composition of the present invention is one, or any combination, of the above-mentioned.

The (E) phosphazene contained in the resin composition of the present invention is phosphorus-containing and nitrogen-containing compounds, such as compounds expressed by the formula below, which are flame resistant. During the process of combustion of a laminate formed as a result of the curing of the halogen-free resin composition, phosphorus atoms of the phosphazene form coke-like phosphate which covers the surface of the laminate to prevent air from being admitted thereto, thereby terminating the combustion process. Unlike a conventional halogen-based flame retardant such as a bromide flame retardant, the phosphazene-containing halogen-free composition of the present invention does not produce hazardous substances, such as dioxin, during combustion.

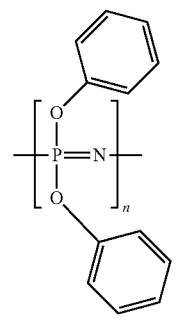

Where n is a positive integer larger than 1.

As regards the phosphazene of the present invention, given 100 parts by weight of polyphenylene oxide resin, 15 to 150 parts by weight of phosphazene is added thereto. If less than 15 parts by weight of phosphazene is added, the flame retardation of the halogen-free resin composition will be unsatisfactory. If more than 150 parts by weight of phosphazene is added, the laminate CTE will be overly large, and the laminate heat resistance will deteriorate. The advantage of including phosphazene in the halogen-free resin composition of the present invention is to enhance the flame retardation of the halogen-free resin composition and its cured products. Due to the flame resistant compounds included, the halogen-free resin composition of the present invention attains UL94 V-0 flame retardation, such that laminates and circuit boards which use the halogen-free resin composition manifest satisfactory flame retardation.

The main advantage of using phosphazene as a flame retardant according to the present invention is that the phosphazene has high phosphorus content (13%), delaminated temperature (Td) of higher than 350° C. (5% weight loss temperature, which is higher than that of the other types of phosphorus-containing flame retardants), satisfactory hydrolysis resistance, lower hygroscopic property, and a high glass transition temperature (Tg).

A conventional phosphorus-containing flame retardant, such as phosphate flame retardant (OP-930, OP-935), manifests unsatisfactory hydrolysis impedance resistance. For example, phosphorus-containing phenol curing agent DOPO-HQ (or known as HCA-HQ) and Fyrol PMP have a polar group hydroxyl and therefore not only deteriorate the electrical properties of the resin composition but also have low delaminated temperature (lower than 340° C.).

The (E) phosphazene in the resin composition of the present invention is preferably vinyl phosphazene.

The vinyl phosphazene comprises the structure expressed by formula (I) below.

formula (I)

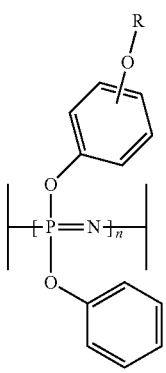

wherein R is a C1 to C20 linear alkyl group, a C1 to C20 cycloalkyl group, a C1 to C20 benzyl group, or a C1 to C20 aromatic functional group, each being substituted by a vinyl group, wherein n is an integer from 1 to 6.

The vinyl phosphazene comprises the structure expressed by formula (II) below.

formula (II)

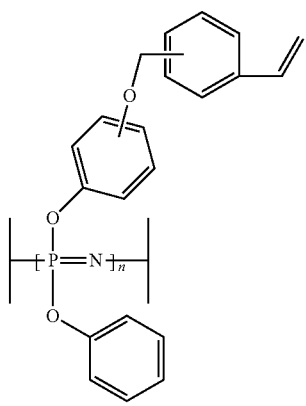

where n is an integer from 1 to 6.

The vinyl phosphazene comprises the structure expressed by formula (III) below.

formula (III)

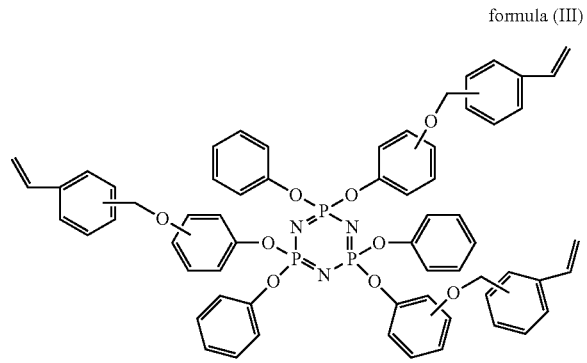

The vinyl phosphazene of the present invention is produced by the reaction between a phosphazene having a hydroxyl group and a vinyl compound.

As regards the method, the vinyl compound is selected from one of 4-chlro-methyl styrene, 3-chlro-methyl styrene, and 2-chlro-methyl styrene, or any combination thereof.

As regards the method, it preferably involves using the following two compounds to undergo a reaction, for example, undergoing the reaction in the presence of sodium hydroxide and tetrabutylammonium iodide, but the method is not restricted to the two compounds.

The method of manufacturing a vinyl phosphazene according to the present invention preferably involves allowing phosphazene having a hydroxyl group and 4-chlro-methyl styrene to undergo a reaction in toluene solvent and therefore produce vinyl phosphazene (known as vinyl benzyl etherified phosphazene or vinyl benzyl etherified phosphorus nitrogen compound at this moment) and preferably undergoing the reaction in the presence of two compounds, namely sodium hydroxide and tetrabutylammonium iodide. Furthermore, a method of manufacturing the vinyl phosphazene of the present invention is preferably characterized in that: after the reaction, the product is rinsed with methanol, such that impurity is removed with methanol; and, if halogen-containing constituents of the reactants undergo the reaction to produce sodium halide (e.g., sodium chloride), the sodium halide will be washed off and removed by methanol, such that the vinyl phosphazene of the present invention is a halogen-free flame retardant compound.

The vinyl phosphazene of the present invention has advantages over conventional phosphazene as follows:

The vinyl phosphazene of the present invention has a vinyl group, such that the vinyl group of the vinyl phosphazene of the present invention can react with another compound having a vinyl group by means of a peroxide. A typical conventional phosphazene does not have any functional group and therefore cannot react with the other resins.

The vinyl phosphazene of the present invention manifests better dielectric properties than a phosphazene having a hydroxyl group.

The vinyl phosphazene of the present invention manifests lower coefficient of thermal expansion than a conventional phosphazene when included in the resin composition of the present invention.

To enhance the flame retardation of the halogen-free resin composition of the present invention, preferably, the halogen-free resin composition of the present invention not only includes phosphazene but optionally includes at least one of the specific fire-resistant compounds below. The selected fire-resistant compounds include, but are not limited to, phosphates and nitrogen-containing phosphates. Specifically speaking, the fire-resistant compounds preferably include, but are not limited to, at least one of the following compounds: bisphenol diphenyl phosphate, ammonium polyphosphate, hydroquinone bis-(diphenyl phosphate), bisphenol A bis-(diphenylphosphate), tri(2-carboxyethyl) phosphine (TCEP), tri(chloroisopropyl) phosphate (TCPP), trimethyl phosphate (TMP), dimethyl methyl phosphonate (DMMP), resorcinol dixylenylphosphate (RDXP, such as PX-200), melamine polyphosphate, phosphazene, 9,10-dihydro-9-oxa-10-phosphaphenanthrene-10-oxide (DOPO) and its derivatives or resins, melamine cyanurate, and trihydroxy ethyl isocyanurate. For example, the fire-resistant compounds can be DOPO-containing compounds, DOPO-containing resins (such as DOPO-HQ, DOPO-PN, DOPO-BPN), and DOPO-containing epoxy resin, wherein DOPO-BPN can be bisphenol novolac, such as DOPO-BPAN, DOPO-BPFN, and DOPO-BPSN.

The halogen-free resin composition of the present invention further includes (F) 10 to 500 parts by weight of an inorganic filler. The purpose of the inorganic filler is to increase the thermal conductivity, enhance thermal expansion, and enhance mechanical strength of the resin composition of the present invention. The inorganic filler is preferably distributed in the resin composition of the present invention uniformly.

The inorganic filler comprises silicon dioxide (existing in a fused state or a non-fused state, or featuring a porous structure or a hollow-core structure), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, quasi diamond powder, graphite, magnesium carbonate, potassium titanate, ceramic fiber, mica, boehmite (AlOOH), zinc molybdate, ammonium molybdate, zinc borate, calcium phosphate, calcinated talc, talc, silicon nitride, mullite, calcinated kaolinite, clay, alkaline magnesium sulfate whisker, mullite whisker, barium sulfate, magnesium hydroxide whisker, magnesium oxide whisker, calcium oxide whisker, carbon nanotube, nanoscale silicon dioxide, the related inorganic powder thereof, or powder particles having an organic core and an insulator coating. The inorganic filler is spherical, fiber-like, plate-like, particle-like, sheet-like, or needle-shaped, and is optionally pretreated with a silane coupling agent.

The resin composition of the present invention further comprises at least one of epoxy resin, phenol resin, phenol novolac resin, amine crosslinking agent, isocyanate ester resin, phenoxy resin, benzoxazine resin, styrene resin, polybutadiene resin, polyamide resin, polyimide resin, polyester resin, and modified derivatives thereof.

The resin composition of the present invention further includes an epoxy resin which is one of bisphenol A epoxy resin, bisphenol F epoxy resin, bisphenol S epoxy resin, bisphenol AD epoxy resin, phenol novolac epoxy resin, bisphenol A novolac epoxy resin, o-cresol novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin, benzopyran epoxy resin, biphenyl novolac epoxy resin, and phenol aralkyl novolac epoxy resin, or any combination thereof.

The resin composition of the present invention optionally includes dicyclopentadienyl (DCPD) epoxy resin or naphthalene epoxy resin. The dicyclopentadienyl (DCPD) epoxy resin decreases hydroscopicity of the resin composition. The naphthalene epoxy resin increases rigidity and heat resistance of the resin composition.

The resin composition of the present invention further optionally comprises additives, such as a curing accelerator, a surfactant, a silane coupling agent, a toughening agent, or a solvent. The curing accelerator increases the reaction rate of the resin composition. The surfactant improves the uniform distribution of the inorganic filler in the resin composition and prevents the agglomeration of the inorganic filler. The toughening agent improves the physical toughness of the resin composition. The solvent changes the concentration of solid content in the resin composition and adjusts the viscosity of the resin composition.

The curing accelerator comprises a catalyst, such as a lewis base or a lewis acid. The lewis base includes imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MZ), triphenylphosphine (TPP), and/or 4-dimethylaminopyridine (DMAP). The lewis acid comprises metallic salt compounds, such as the metallic salts of manganese, iron, cobalt, nickel, copper, and zinc, namely metallic catalysts, such as zinc caprylate, and cobalt caprylate.

The curing accelerator preferably comprises a peroxide which produces free radicals, including but not limited to dicumyl peroxide, tert-butyl peroxybenzoate, and di(tert-butylperoxyisopropyl)benzene (BIPB). In an embodiment of the present invention, the curing accelerator applicable to the resin composition of the present invention is preferably di(tert-butylperoxyisopropyl)benzene (BIPB).

As regards the resin composition of the present invention, given 100 parts by weight of polyphenylene oxide resin, it comprises 0.1 to 10 parts by weight of the curing accelerator.

The silane coupling agent comprises silanes and siloxane which are of the following types, namely amino silane, amino siloxane, epoxy silane, and epoxy siloxane, according to functional group.

The toughening agent of the present invention comprises rubber resin, carboxyl-terminated butadiene acrylonitrile (CTBN) rubber, and/or core-shell rubber.

The solvent comprises methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether, or a mixture thereof.

Another objective of the present invention is to provide a prepreg characterized by a high glass transition temperature, low coefficient of thermal expansion, (CTE, Z-axis), low dielectric properties, heat resistance, flame retardation, and being halogen-free. Accordingly, the prepreg of the present invention comprises a reinforcing material and the aforesaid resin composition, wherein the resin composition is attached to the reinforcing material by means of impregnation and heated up at a high temperature to become semi-cured. The reinforcing material is a fibrous material, a woven fabric, or a non-woven fabric, such as a glass fiber fabric, and is intended to increase the mechanical strength of the prepreg. Also, the reinforcing material can be optionally pretreated with a silane coupling agent.

When heated up at a high temperature or heated up at a high temperature and a high pressure, the prepreg can be cured to form a cured prepreg or a solid-state insulating layer, wherein, if the resin composition contains a solvent, the solvent will evaporate and escape during a high-temperature heating process.

Another objective of the present invention is to provide a resin film characterized by properties, such as a high glass transition temperature, low coefficient of thermal expansion, low dielectric properties, heat resistance, flame retardation, and being halogen-free. The resin film comprises the aforesaid resin composition. The resin film is applied to a polyester film (e.g. PET film) or a polyimide film (e.g. PI film). Alternatively, the resin film is applied to a resin coated copper (RCC) on a copper foil and then heated by baking.

Yet another objective of the present invention is to provide a laminate, such as a copper clad laminate which has properties, namely a high glass transition temperature, low coefficient of thermal expansion, low dielectric properties, heat resistance, flame retardation, and being halogen-free, and is particularly applicable to high-speed high-frequency signal transmission circuit boards. To this end, the present invention provides a laminate which comprises two or more metal foils and at least one insulating layer. The metal foils are copper foils, for example, and further comprise an alloy of at least one of aluminum, nickel, platinum, silver, and gold. The insulating layer is formed by curing the aforesaid prepreg or resin film at high temperature and high pressure, for example, putting the aforesaid prepreg between the two metal foils and laminating them against each other at high temperature and high pressure.

The laminate of the present invention at least has the advantages described as follows: a low coefficient of thermal expansion, a low dielectric constant, a low dielectric dissipation factor, heat resistant, flame resistant, halogen-free, and environmentally friendly. The laminate further undergoes a circuit fabrication process to form a circuit board. After electronic components have been mounted on the circuit board, the circuit board operates well even at adverse environments, such as high temperature and high humidity.

A further objective of the present invention is to provide a printed circuit board which has properties, namely low coefficient of thermal expansion, low dielectric properties, heat resistance, flame retardation, and being halogen-free, and is particularly applicable to high-speed high-frequency signal transmission. The circuit board comprises at least one aforesaid laminate and can be manufactured by a conventional process.

The embodiments below further disclose and describe the present invention so as to enable persons skilled in the art to implement the present invention accordingly. The embodiments below are illustrative, rather than restrictive, of the present invention. All equivalent modifications and changes made to the embodiments below by persons skilled in the art without departing from the spirit embodied in the present invention shall fall within the scope of the present invention.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Manufacturing Example 1

Put 260 g of the phosphazene (compound A, SPH-100) having a hydroxyl group, 150 g of 4-chlro-methyl styrene (CMS-P), and toluene in a reactor. Set the temperature in the reactor to 50~80° C. Start blending the aforesaid chemicals in the reactor. In the course of the blending process, the solid-state phosphazene compound having a hydroxyl group dissolves and thus changes to a liquid state. Then, add 40 g of sodium hydroxide and 1 g of tetrabutylammonium iodide to the reactor and keep blending the chemical therein for 6 hours. Afterward, rinse the chemicals in the reactor with methanol to thereby obtain a vinyl benzyl ether phosphazene (compound B). The vinyl benzyl ether phosphazene falls into the category of a vinyl phosphazene, and it appears in the form of a brown solution (vinyl benzyl ether phosphazene and toluene) of 150 g.

Figure 1:
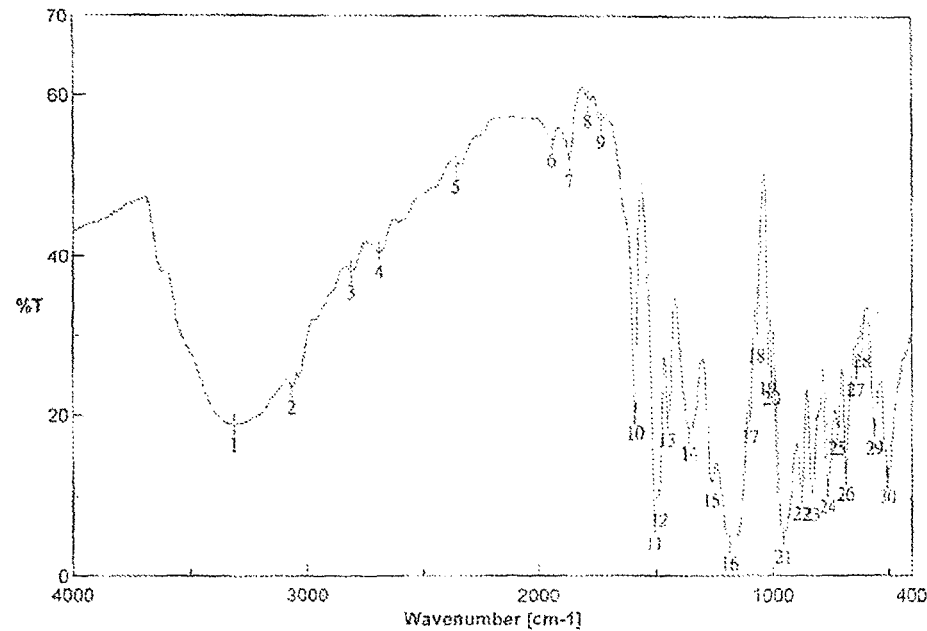
FIG. 1 shows a FTIR spectrum of a phosphazene (compound A) having a hydroxyl group.
Figure 2:
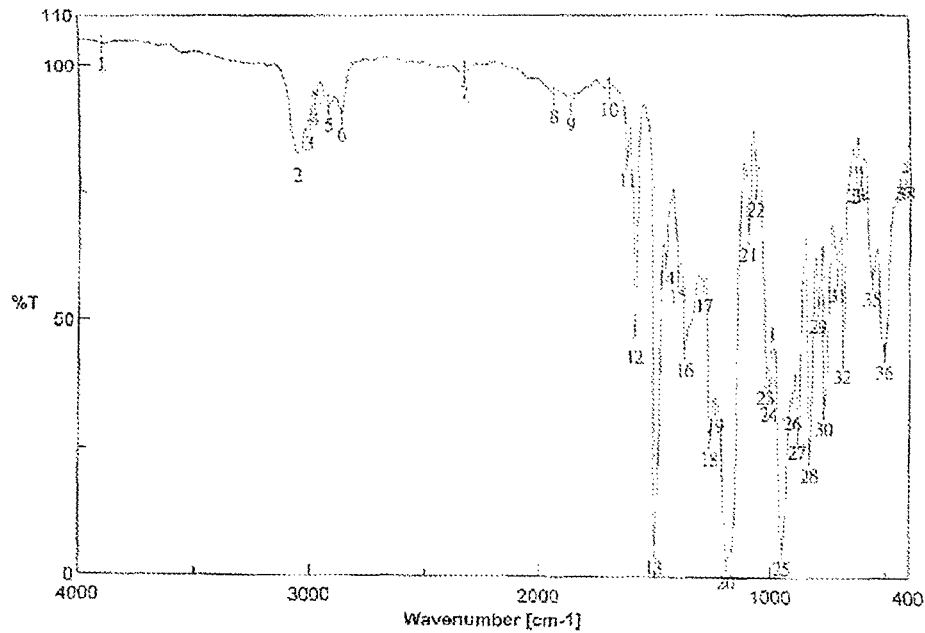
FIG. 2 shows a FTIR spectrum of a vinyl phosphazene (compound B)
Figure 3:
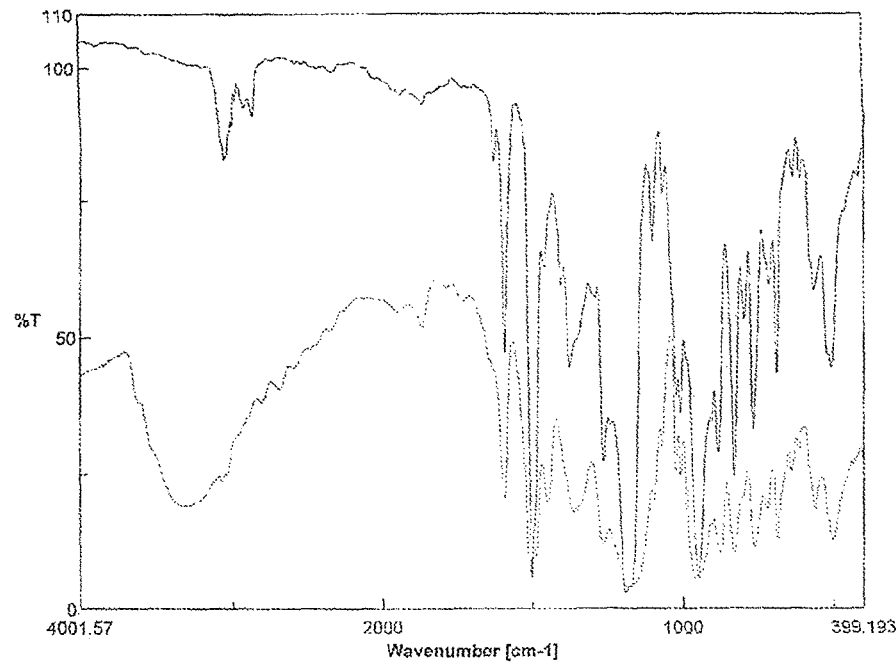
FIG. 3 is a diagram of comparison of the FTIR spectra of the phosphazene (compound A) having a hydroxyl group and the vinyl phosphazene (compound B).

The method for testing the aforesaid vinyl phosphazene involves the use of FTIR, as shown in FIG. 1, FIG. 2 and FIG. 3. FIG. 1 shows a FTIR spectrum of a phosphazene (compound A) having a hydroxyl group according to the present invention, wherein a peak indicative of a hydroxyl group (OH functional group) is displayed at 3300~3350 $cm^{-1}$ of the FTIR spectrum. FIG. 2 shows a FTIR spectrum of a vinyl phosphazene (compound B) according to the present invention, revealing the absence of any peak indicative of a hydroxyl group (OH functional group) at 3300~3350 $cm^{-1}$ of the FTIR spectrum, but revealing a peak indicative of a vinyl functional group (carbon-carbon double bond) at 1600~1700 $cm^{-1}$ of the FTIR spectrum, thereby proving the presence of the vinyl phosphazene of the present invention.

Afterward, the vinyl phosphazene, as synthesized in manufacturing example 1, is included in the resin composition in embodiments and comparisons, and then the resultant resin composition is compared with another commercially available phosphorus-containing flame retardant. The resin composition in embodiments 1-12 is enumerated in Table 1. The resin composition in comparisons 1-12 is enumerated in Table 3.

Embodiment 1-1 (E1-1)

A resin composition, comprising ingredients as follows:
(A) 100 parts by weight of SA-9000 (polyphenylene oxide resin);
(B) 15 parts by weight of BMI-2300 (maleimide resin);
(C) 10 parts by weight of Ricon257 (styrene butadiene divinyl benzene terpolymer);
(D) 10 parts by weight of BTP-6020S (cyanate ester resin);
(E) 50 parts by weight of SPB-100 (phosphazene);
(F) 125 parts by weight of fused silica (inorganic filler);
(G) 200 parts by weight of toluene (solvent);
(H) 3 parts by weight of 25B (curing accelerator).

Embodiment 1-2 (E1-2)

A resin composition, comprising ingredients as follows:
(A) 100 parts by weight of SA-9000 (polyphenylene oxide resin);
(B) 15 parts by weight of BMI-2300 (maleimide resin);
(C) 10 parts by weight of Ricon257 (styrene butadiene divinyl benzene terpolymer);
(D) 10 parts by weight of BTP-6020S (cyanate ester resin);
(E) 50 parts by weight of SPH-100 (phosphazene having a hydroxyl group);
(F) 125 parts by weight of fused silica (inorganic filler);
(G) 200 parts by weight of toluene (solvent);
(H) 3 parts by weight of 25B (curing accelerator).

Embodiment 1-3 (E1-3)

A resin composition, comprising ingredients as follows:
(A) 100 parts by weight of SA-9000 (polyphenylene oxide resin);
(B) 15 parts by weight of BMI-2300 (maleimide resin);
(C) 10 parts by weight of Ricon257 (styrene butadiene divinyl benzene terpolymer);
(D) 10 parts by weight of BTP-6020S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 2 (E2)

A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 55 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 3 (E3)
A resin composition, comprising ingredients as follows:
(A) 100 parts by weight of SA90 (polyphenylene oxide resin);
(B) 15 parts by weight of KI-80 (maleimide resin);
(C) 50 parts by weight of H-1052 (hydrogenated diene-butadiene-styrene copolymer);
(D) 15 parts by weight of BA-3000S (cyanate ester resin);
(E) 45 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 4 (E4)
A resin composition, comprising ingredients as follows:
(A) 100 parts by weight of SA-120 (polyphenylene oxide resin);
(B) 15 parts by weight of BMI-1700 (maleimide resin);
(C) 10 parts by weight of H-1052 (hydrogenated diene-butadiene-styrene copolymer);
(D) 20 parts by weight of PT-30 (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 5 (E5)
A resin composition, comprising ingredients as follows:
(A) 100 parts by weight of OPE-2st (polyphenylene oxide resin);
(B) 10 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 6 (E6)
A resin composition, comprising ingredients as follows:
(A) 100 parts by weight of OPE-2st (polyphenylene oxide resin);
(B) 50 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 7 (E7)
A resin composition, comprising ingredients as follows:
(A) 100 parts by weight of OPE-2st (polyphenylene oxide resin);
(B) 15 parts by weight of BMI-5100 (maleimide resin);
(C) 5 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 8 (E8)
A resin composition, comprising ingredients as follows:
(A) 100 parts by weight of OPE-2st (polyphenylene oxide resin);
(B) 15 parts by weight of BMI-5100 (maleimide resin);
(C) 100 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 9 (E9)
A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 5 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 10 (E10)
A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 30 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 11 (E11)
A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 15 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Embodiment 12 (E12)
A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 150 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 1 (C1)
A resin composition, comprising ingredients as follows:
(A) 5 parts by weight of OPE-2st (polyphenylene oxide resin);
(B) 10 parts by weight of BMI-5100 (maleimide resin);
(C) 100 parts by weight of H-1052 (hydrogenated diene-butadiene-styrene copolymer);
(D) 100 parts by weight of BTP-6020S (cyanate ester resin);
(E) 50 parts by weight of Melapur200 (melamine polyphosphate);
(F) 90 parts by weight of fused silica (inorganic filler);
(G) 130 parts by weight of toluene (solvent);
(H) 3 parts by weight of 25B (curing accelerator).

Comparison 2 (C2)

A resin composition, comprising ingredients as follows:
(A) 5 parts by weight of SA-9000 (polyphenylene oxide resin);
(B) 0.5 part by weight of BMI-2300 (maleimide resin);
(C) 0 part by weight of H-1052 (hydrogenated diene-butadiene-styrene copolymer);
(D) 100 parts by weight of BTP-6020S (cyanate ester resin);
(E) 50 parts by weight of SPB-100 (phosphazene);
(F) 90 parts by weight of fused silica (inorganic filler);
(G) 130 parts by weight of toluene (solvent);
(H) 3 parts by weight of 25B (curing accelerator).

Comparison 3 (C3)

A resin composition, comprising ingredients as follows:
(A) 5 parts by weight of EF-80 (styrene maleic anhydride copolymer);
(B) 50 parts by weight of KI-80 (maleimide resin);
(C) 50 parts by weight of H-1052 (hydrogenated diene-butadiene-styrene copolymer);
(D) 100 parts by weight of BTP-6020S (cyanate ester resin);
(E) 50 parts by weight of OP-935 (aluminum phosphate compound);
(F) 90 parts by weight of fused silica (inorganic filler);
(G) 130 parts by weight of toluene (solvent);
(H) 3 parts by weight of 25B (curing accelerator).

Comparison 4 (C4)

A resin composition, comprising ingredients as follows:
(A) 100 parts by weight of A-PPE-M (polyphenylene oxide resin);
(B) 5 parts by weight of BMI-1700 (maleimide resin);
(C) 10 parts by weight of H-1052 (hydrogenated diene-butadiene-styrene copolymer);
(D) 0.5 part by weight of PT-30 (cyanate ester resin);
(E) 50 parts by weight of FR300 (phosphorus-containing cyanate ester);
(F) 125 parts by weight of fused silica (inorganic filler);
(G) 200 parts by weight of toluene (solvent);
(H) 3 parts by weight of 25B (curing accelerator).

Comparison 5 (C5)

A resin composition, comprising ingredients as follows:
(A) 100 parts by weight of OPE-2st (polyphenylene oxide resin);
(B) 5 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 6 (C6)

A resin composition, comprising ingredients as follows:
(A) 100 parts by weight of OPE-2st (polyphenylene oxide resin);
(B) 60 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 7 (C7)

A resin composition, comprising ingredients as follows:
(A) 100 parts by weight of OPE-2st (polyphenylene oxide resin);
(B) 15 parts by weight of BMI-5100 (maleimide resin);
(C) 0 part by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 8 (C8)

A resin composition, comprising ingredients as follows:
(A) 100 parts by weight of OPE-2st (polyphenylene oxide resin);
(B) 15 parts by weight of BMI-5100 (maleimide resin);
(C) 110 parts by weight of H-1052 (hydrogenated diene-butadiene-styrene copolymer);
(D) 10 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 9 (C9)

A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 0 part by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 10 (C10)

A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 40 parts by weight of BA-230S (cyanate ester resin);
(E) 50 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 11 (C11)

A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 10 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

Comparison 12 (C12)

A resin composition, comprising ingredients as follows:
(A) 100 parts by weight of OPE-2st (polyphenylene oxide resin);
(B) 15 parts by weight of BMI-5100 (maleimide resin);
(C) 20 parts by weight of H-1052 (hydrogenated diene-butadiene-styrene copolymer);
(D) 10 parts by weight of BA-230S (cyanate ester resin);
(E) 170 parts by weight of compound B (vinyl phosphazene);
(F) 125 parts by weight of fused silica (inorganic filler);
(G) 200 parts by weight of toluene (solvent);
(H) 3 parts by weight of 25B (curing accelerator).

The chemicals for use in the manufacturing example, embodiments, and comparisons are as follows:

SA-9000, SA-90, SA-120, A-PPE-M: polyphenylene oxide resin purchased from Sabic.
OPE-2st: vinyl benzyl ether-terminated polyphenylene oxide resin purchased from Mitsubishi Gas Chemical.
BMI-2300, BMI-5100, BMI-1700: bismaleimide resin purchased from Daiwa Kasei.
KI-80: bismaleimide resin purchased from KI chemical.
25B: 2,5-dimethyl-2,5-di(t-butylperoxy) hexyne-3 purchased from Nippon Oil & Fats.
Ricon257: styrene butadiene divinyl benzene terpolymer purchased from Sartomer.
H-1052: hydrogenated diene-butadiene-styrene copolymer purchased from Asahi Kasei.
BA-230S, BA-3000S, BTP-6020S, PT-30: cyanate ester resin purchased from Lonza.
SPH-100: phosphazene having a hydroxyl group, purchased from Otsuka Chemical.
SPB-100: phosphazene purchased from Otsuka Chemical.
Melapur200: melamine polyphosphate purchased from BASF.
OP-935: aluminum phosphate compound purchased from Clariant.
FR300: phosphorus-containing cyanate ester purchased from Lonza.

The ingredients of the resin composition in the embodiments 1-12 and comparisons 1-12 are evenly mixed in a blender batch by batch before being put into an impregnation tank. Then, a glass fiber fabric is passed through the impregnation tank to allow the resin composition to adhere to the glass fiber fabric before undergoing a heating and baking process to become semi-cured, thereby forming a prepreg.

A piece of 18-μm copper foil, four pieces of the prepreg prepared by the same batch, and another piece of 18-μm copper foil are stacked in sequence before being laminated against each other in vacuum at 210° C. for two hours to form a copper-clad laminate (CCL). The four pieces of prepreg are cured to form an insulating layer between the two copper foils.

A physical properties measurement process is performed on the copper-clad laminates and the copper-free laminates produced by etching the copper foils. The physical properties measurement process entails: measuring the glass transition temperature (Tg, measured with DMA instrument), heat resistance (T288), coefficient of thermal expansion, (CTE z-axis, alpha 1: at 50~120° C., measured with TMA instrument, at ppm/° C., wherein the CTE is the lower the better), performing copper-clad laminate immersion tin test (solder dip, S/D, at 288° C., for 10 seconds, to measure heat resistance cycle), performing immersion tin test (pressure cooking at 121° C., for 3 hours, to test solder dip at 288° C. for 20 seconds to inspect for board rupture) after the copper-free laminate PCT has undergone water absorption, measuring the peeling strength between the copper foil and the laminate (peeling strength, P/S, half ounce copper foil, wherein the peeling strength between the copper foil and the laminate is the greater the better), measuring dielectric constant (Dk) (wherein dielectric constant (Dk) is the lower the better), measuring dielectric dissipation factor (Df) (wherein dissipation factor (Df) is the lower the better), and evaluating flame retardation (by performing a flaming test, UL94, with the ranking: V-0>V-1.)

The results of laminate physical properties measurement of the resin composition in embodiments 1-12 are enumerated in Table 2. The results of laminate physical properties measurement of the resin composition in comparisons 1-12 are enumerated in Table 4. Referring to Table 2 and Table 4, an integrated comparison of embodiments 1-12 and comparisons 1-12 reveals the following: the halogen-free resin composition of the present invention is characterized by specific ingredients and proportions thereof to attain properties of circuit board laminates, namely a high glass transition temperature, low coefficient of thermal expansion, low dielectric properties, heat resistance, flame retardation, and being halogen-free. The result of comparisons 1-12 indicates that the laminate thus manufactured manifests a significantly high CTE and unsatisfactory dielectric properties and heat resistance.

The result of a comparison of vinyl-modified phosphazene (embodiment 1-3), phosphazene having a hydroxyl group (embodiment 1-2), and phosphazene (embodiment 1-1) indicates that a laminate manufactured from the resin composition which contains vinyl phosphazene features a further reduced CTE and enhanced flame retardation, heat resistance and dielectric properties. The test result of embodiment 1-1 reveals an unsatisfactory CTE, because the resin composition in embodiment 1-1 contains a typical unmodified phosphazene and therefore manifests unsatisfactory thermal expansion. The resin composition in embodiment 1-2 contains phosphazene having a hydroxyl group and therefore manifests an increase in the hydroxyl content of the laminate, and in consequence the laminate manifests unsatisfactory dielectric properties, heat resistance and flame retardation.

Furthermore, the resin composition ingredients in embodiments 5-12 are the same as that in comparisons 5-12, though the resin composition in embodiments 5-12 is different from that in comparisons 5-12 in terms of the parts by weight of one of the ingredients, wherein their test results serve a comparative purpose. In comparisons 5 and 6, the resin compositions contain low and high parts by weight of maleimide resin, respectively, causing deterioration of Tg and dielectric properties of the laminate. In comparisons 7 and 8, the resin compositions contain low and high parts by weight of polybutadiene copolymer, respectively, causing deterioration of dielectric properties, Tg, heat resistance, and flame retardation of the laminate. In comparisons 9 and 10, the resin compositions contain low and high parts by weight of cyanate ester resin, respectively, causing deterioration of dielectric properties of the laminate. In comparisons 11 and 12, the resin compositions contain low and high parts by weight of vinyl phosphazene, respectively, causing deterioration of flame retardation, heat resistance, and dielectric properties of the laminate.

Accordingly, the test results of the embodiments and comparisons indicate that the halogen-free resin composition of the present invention is characterized by specific ingredients and proportions thereof to achieve circuit board laminate properties, such as a high glass transition temperature, low coefficient of thermal expansion, low dielectric properties, heat resistance, flame retardation, and being halogen-free, and indicate that a laminate manufactured from a resin composition which includes vinyl phosphazene manifests a further reduced CTE and enhanced flame retardation, heat resistance, and dielectric properties.

Hence, the present invention meets the three requirements of patentability, namely novelty, non-obviousness, and industrial applicability. Regarding novelty and non-obviousness, the halogen-free resin composition of the present invention is characterized by specific ingredients and proportions thereof to achieve circuit board laminate properties, such as a high glass transition temperature, low coefficient of thermal expansion, low dielectric properties, heat resistance, flame retardation, and being halogen-free. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent variations or replacements made to the aforesaid embodiments should fall within the scope of the present invention, provided that they do not depart from the spirit embodied in the present invention. Accordingly, the legal protection for the present invention should be defined by the appended claims.

TABLE 1

| ingredient | | E1-1 | E1-2 | E1-3 | E2 | E3 | E4 | E5 | E6 | E7 | E8 | E9 | E10 | E11 | E12 |
|---|---|---|---|---|---|---|---|---|---|---|---|---|---|---|---|
| polyphenylene oxide resin | SA-9000 | 100 | 100 | 100 | — | — | — | — | — | — | — | — | — | — | — |
| | OPE-2st | — | — | — | 100 | — | — | 100 | 100 | 100 | 100 | 100 | 100 | 100 | 100 |
| | SA-90 | — | — | — | — | 100 | — | — | — | — | — | — | — | — | — |
| | SA-120 | — | — | — | — | — | 100 | — | — | — | — | — | — | — | — |
| maleimide resin | BMI-2300 | 15 | 15 | 15 | — | — | — | — | — | — | — | — | — | — | — |
| | BMI-5100 | — | — | — | 15 | — | — | 10 | 50 | 15 | 15 | 15 | 15 | 15 | 15 |
| | KI-80 | — | — | — | — | 15 | — | — | — | — | — | — | — | — | — |
| | BMI-1700 | — | — | — | — | — | 15 | — | — | — | — | — | — | — | — |
| polybutadiene copolymer | Ricon257 | 10 | 10 | 10 | — | — | — | — | — | — | — | — | — | — | — |
| | H-1052 | — | — | — | 20 | 50 | 10 | 20 | 20 | 5 | 100 | 20 | 20 | 20 | 20 |
| cyanate ester resin | BTP-6020S | 10 | 10 | 10 | — | — | — | — | — | — | — | — | — | — | — |
| | BA-230S | — | — | — | 10 | — | — | 10 | 10 | 10 | 10 | 5 | 30 | 10 | 10 |
| | BA-3000S | — | — | — | — | 15 | — | — | — | — | — | — | — | — | — |
| | PT-30 | — | — | — | — | — | 20 | — | — | — | — | — | — | — | — |
| flame retardant | SPB-100 | 50 | — | — | — | — | — | | | | | | | | |
| | SPH-100 | — | 50 | — | — | — | — | | | | | | | | |
| | Compound B | — | — | 50 | 55 | 45 | 50 | 50 | 50 | 50 | 50 | 50 | 50 | 15 | 150 |
| inorganic filler | Fused silica | 125 | 125 | 125 | 125 | 125 | 125 | 125 | 125 | 125 | 125 | 125 | 125 | 125 | 125 |
| solvent | toluene | 200 | 200 | 200 | 200 | 200 | 200 | 200 | 200 | 200 | 200 | 200 | 200 | 200 | 200 |
| curing accelerator | 25B | 3 | 3 | 3 | 3 | 3 | 3 | 3 | 3 | 3 | 3 | 3 | 3 | 3 | 3 |

TABLE 2

| property test | method | E1-1 | E1-2 | E1-3 | E2 | E3 | E4 | E5 | E6 | E7 |
|---|---|---|---|---|---|---|---|---|---|---|
| Tg | DMA | 189 | 198 | 203 | 210 | 200 | 219 | 200 | 225 | 220 |
| T288 | TMA (min) | >60 | 30 | >60 | >60 | >60 | >60 | >60 | >60 | >60 |
| CTE (50~120° C.) | ppm/° C. | 79 | 55 | 46 | 42 | 45 | 41 | 50 | 39 | 41 |
| S/D | dip cycles | >20 | 15 | >20 | >20 | >20 | >20 | >20 | >20 | >20 |
| PCT(3 hr) | dip 288° C., 20 s | pass | fail | pass | pass | pass | pass | pass | pass | pass |
| P/S | Hoz Cu foil | 5.9 | 5.89 | 5.25 | 5.6 | 5.3 | 6.1 | 5.89 | 5.95 | 5.84 |
| Dk | 10 GHz | 3.81 | 3.98 | 3.78 | 3.75 | 3.71 | 3.93 | 3.75 | 3.91 | 3.97 |
| Df | 10 GHz | 0.0067 | 0.0094 | 0.0063 | 0.0055 | 0.0059 | 0.0058 | 0.0056 | 0.0061 | 0.0065 |
| flaming test | UL94 | V-0 | V-1 | V-0 | V-0 | V-0 | V-0 | V-0 | V-0 | V-0 |

| property test | method | E8 | E9 | E10 | E11 | E12 |
|---|---|---|---|---|---|---|
| Tg | DMA | 180 | 212 | 228 | 201 | 205 |
| T288 | TMA (min) | >60 | >60 | >60 | >60 | 30 |
| CTE (50~120° C.) | ppm/° C. | 65 | 43 | 40 | 50 | 55 |
| S/D | dip cycles | >20 | >20 | >20 | >20 | 15 |
| PCT(3 hr) | dip 288° C., 20 s | pass | pass | pass | pass | pass |
| P/S | Hoz Cu foil | 5.24 | 5.92 | 6.15 | 5.55 | 5.78 |
| Dk | 10 GHz | 3.65 | 3.93 | 3.91 | 3.76 | 3.97 |
| Df | 10 GHz | 0.0055 | 0.0059 | 0.0060 | 0.0060 | 0.0057 |
| flaming test | UL94 | V-1 | V-0 | V-0 | V-0 | V-0 |

TABLE 3

| ingredient | | C1 | C2 | C3 | C4 | C5 | C6 | C7 | C8 | C9 | C10 | C11 | C12 |
|---|---|---|---|---|---|---|---|---|---|---|---|---|---|
| polyphenylene oxide resin | SA-9000 | — | 5 | — | — | — | — | — | — | — | — | — | — |
| | OPE-2st | 5 | — | — | — | 100 | 100 | 100 | 100 | 100 | 100 | 100 | 100 |
| | A-PPE-M | — | — | — | 100 | — | — | — | — | — | — | — | — |
| Styrene maleic anhydride copolymer | EF-80 | — | — | 5 | — | — | — | — | — | — | — | — | — |
| maleimide resin | BMI-2300 | — | 0.5 | — | — | — | — | — | — | — | — | — | — |
| | BMI-5100 | 10 | — | — | — | 5 | 60 | 15 | 15 | 15 | 15 | 15 | 15 |
| | KI-80 | — | — | 50 | — | — | — | — | — | — | — | — | — |
| | BMI-1700 | — | — | — | 5 | — | — | — | — | — | — | — | — |
| polybutadiene copolymer | H-1052 | 100 | 0 | 50 | 10 | 20 | 20 | 0 | 110 | 20 | 20 | 20 | 20 |
| cyanate ester resin | BTP-6020S | 100 | 100 | 100 | — | — | — | — | — | — | — | — | — |
| | PT-30 | — | — | — | 0.5 | — | — | — | — | — | — | — | — |
| | BA-230S | | | | | 10 | 10 | 10 | 10 | 0 | 40 | 10 | 10 |

TABLE 3-continued

| ingredient | | C1 | C2 | C3 | C4 | C5 | C6 | C7 | C8 | C9 | C10 | C11 | C12 |
|---|---|---|---|---|---|---|---|---|---|---|---|---|---|
| flame retardant | SPB-100 | — | 50 | — | — | — | — | — | — | — | — | — | — |
| | Melapur200 | 50 | — | — | — | — | — | — | — | — | — | — | — |
| | OP-935 | — | — | 50 | — | — | — | — | — | — | — | — | — |
| | FR300 | — | — | — | 50 | — | — | — | — | — | — | — | — |
| | Compound B | — | — | — | — | 50 | 50 | 50 | 50 | 50 | 50 | 10 | 170 |
| inorganic filler | Fused silica | 90 | 90 | 90 | 125 | 125 | 125 | 125 | 125 | 125 | 125 | 125 | 125 |
| solvent | toluene | 130 | 130 | 130 | 200 | 200 | 200 | 200 | 200 | 200 | 200 | 200 | 200 |
| curing accelerator | 25B | 3 | 3 | 3 | 3 | 3 | 3 | 3 | 3 | 3 | 3 | 3 | 3 |

TABLE 4

| property test | method | C1 | C2 | C3 | C4 | C5 | C6 | C7 |
|---|---|---|---|---|---|---|---|---|
| Tg | DMA | 190 | 175 | 181 | 191 | 198 | 228 | 221 |
| T288 | TMA (min) | 50 | 35 | 10 | 30 | >60 | >60 | >60 |
| CTE (50~120° C.) | ppm/° C. | 70 | 85 | 80 | 60 | 55 | 39 | 41 |
| S/D | dip cycles | >20 | 21 | 10 | 15 | >20 | >20 | >20 |
| PCT(3 hr) | dip 288° C., 20 s | pass | fail | fail | fail | pass | pass | pass |
| P/S | Hoz Cu foil | 4.5 | 4.9 | 4.2 | 5.2 | 5.89 | 5.95 | 5.84 |
| Dk | 10 GHz | 3.96 | 3.89 | 4.1 | 3.98 | 3.75 | 3.94 | 3.98 |
| Df | 10 GHz | 0.0088 | 0.0083 | 0.0085 | 0.0087 | 0.0055 | 0.0062 | 0.0066 |
| flame test | UL94 | V-1 | V-0 | V-1 | V-0 | V-0 | V-0 | V-0 |

| property test | method | C8 | C9 | C10 | C11 | C12 |
|---|---|---|---|---|---|---|
| Tg | DMA | 180 | 210 | 230 | 201 | 200 |
| T288 | TMA (min) | >60 | >60 | >60 | >60 | 32 |
| CTE (50~120° C.) | ppm/° C. | 68 | 44 | 40 | 55 | 57 |
| S/D | dip cycles | 14 | >20 | >20 | >20 | 10 |
| PCT(3 hr) | dip 288° C., 20 s | fail | pass | pass | pass | pass |
| P/S | Hoz Cu foil | 5.14 | 5.9 | 6.25 | 5.58 | 5.78 |
| Dk | 10 GHz | 3.63 | 3.93 | 3.95 | 3.76 | 3.97 |
| Df | 10 GHz | 0.0055 | 0.0059 | 0.0067 | 0.006 | 0.0059 |
| flame test | UL94 | V-1 | V-0 | V-0 | V-1 | V-0 |

What is claimed is:

1. A halogen-free resin composition, comprising:
(A) 100 parts by weight of polyphenylene oxide resin;
(B) 10 to 50 parts by weight of maleimide resin;
(C) 5 to 100 parts by weight of polybutadiene copolymer;
(D) 5 to 30 parts by weight of cyanate ester resin; and
(E) 15 to 150 parts by weight of phosphazene,
wherein the phoshazene is vinyl phoshazene,
wherein the vinyl phosphazene comprises a structure expressed by formula (II):

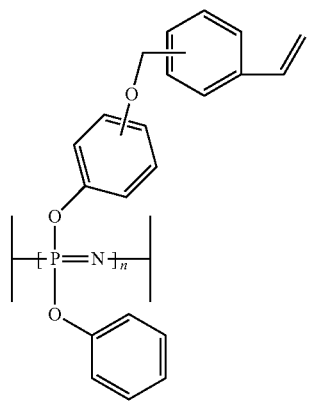

formula (II)

wherein n is an integer from 1 to 6.

2. The halogen-free resin composition of claim 1, wherein the vinyl phosphazene comprises a structure expressed by formula (III):

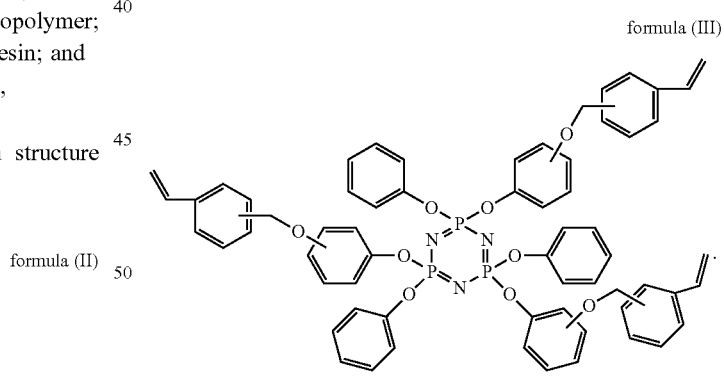

formula (III)

3. The halogen-free resin composition of claim 1, wherein the polyphenylene oxide resin is at least One selected from the group consisting of hydroxyl-terminated polyphenylene oxide resin, vinyl-terminated polyphenylene oxide resin, allyl-terminated polyphenylene oxide resin, and vinyl benzyl ether-terminated polyphenylene oxide resin.

4. The halogen-free resin composition of claim 1, wherein the maleimide resin is at least one selected from the group consisting of 4,4'-diphenylmethane bismaleimide, oligomer of phenylmethane maleimide, m-phenylenebismaleimide, bisphenol A diphenyl ether bismaleimide, 3,3'-dimethyl-5,5'

-diethyl-4,4'-diphenylmethane bismaleimide, 4-methyl-1,3-phenylene bismaleimide, and 1,6-bismaleimide-(2,2,4-trimethyl)hexane.

5. The halogen-free resin composition of claim 1, wherein the cyanate ester resin is any compound having (—O—C≡N) with substituted or unsubstituted dicyclopentadienyl (DCPD) or any compound having Ar—O—C≡N, wherein Ar is a substituted or unsubstituted benzene, biphenyl, naphthalene, phenol novolac, bisphenol A, bisphenol A novolac, bisphenol F, bisphenol F novolac or phenolphthalein.

6. The halogen-free resin composition of claim 1, wherein the polybutadiene copolymer is at least one selected from the group consisting of styrene-butadiene copolymer, hydrogenated diene-butadiene-styrene copolymer, maleic anhydride diene-butadiene-styrene copolymer, styrene-butadiene-styrene copolymer, styrene-isoprene-styrene copolymer, styrene-butadiene-divinyl benzene terpolymer, and maleic anhydride styrene-butadiene copolymer.

7. The halogen-free resin composition of claim 1, further comprising (F) 10 to 500 parts by weight of an inorganic filler.

8. The halogen-free resin composition of claim 1, further comprising at least one of the following additives: a curing accelerator, a surfactant, a silane coupling agent, a toughening agent, and a solvent.

9. A prepreg comprising the halogen-free resin composition of claim 1.

10. A metal laminate comprising the prepreg of claim 9.

11. A printed circuit board comprising the metal laminate of claim 10.

* * * * *